(12) United States Patent
Wang et al.

(10) Patent No.: US 10,340,271 B2
(45) Date of Patent: Jul. 2, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Yan Wang, Shanghai (CN); Fang Yuan Xiao, Shanghai (CN); Hai Yang Zhang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 6 days.

(21) Appl. No.: 15/679,362

(22) Filed: Aug. 17, 2017

(65) Prior Publication Data

US 2018/0061830 A1   Mar. 1, 2018

(30) Foreign Application Priority Data

Aug. 26, 2016   (CN) .......................... 2016 1 0744286

(51) Int. Cl.
*H01L 27/088*   (2006.01)
*H01L 21/8234*   (2006.01)
(Continued)

(52) U.S. Cl.
CPC .... *H01L 27/0886* (2013.01); *H01L 21/76224* (2013.01); *H01L 21/823418* (2013.01);
(Continued)

(58) Field of Classification Search
None
See application file for complete search history.

(56) References Cited

U.S. PATENT DOCUMENTS

| | | | |
|---|---|---|---|
| 2007/0134884 A1* | 6/2007 | Kim | ................ H01L 21/823437 438/424 |
| 2013/0181300 A1* | 7/2013 | Mor | ...................... H01L 29/785 257/401 |

(Continued)

OTHER PUBLICATIONS

The European Patent Office (EPO) The Extended European Search Report for 17186344.2 dated Nov. 7, 2017 11 Pages.

*Primary Examiner* — Joseph C. Nicely
*Assistant Examiner* — Lamont B Koo
(74) *Attorney, Agent, or Firm* — Anova Law Group, PLLC

(57) ABSTRACT

Semiconductor structures and fabrication methods thereof are provided. An exemplary fabrication method includes providing a semiconductor substrate having a first region, a second region and an isolation region between the first region and the second region; forming a plurality of first fins on the semiconductor substrate in the first region and a plurality of second fins on the semiconductor substrate in the second region; forming an isolation structure, covering portions of side surfaces of the first fins and the second fins and with a top surface below the top surfaces of the first fins and the second fins, over the semiconductor substrate; and forming an isolation layer over the isolation structure in the isolation region and with a top surface coplanar or above the top surfaces of the first fins and the second fins.

14 Claims, 7 Drawing Sheets

(51) Int. Cl.
  *H01L 29/66*    (2006.01)
  *H01L 21/8238*  (2006.01)
  *H01L 27/092*   (2006.01)
  *H01L 21/762*   (2006.01)
  *H01L 21/311*   (2006.01)
  *H01L 21/3105*  (2006.01)

(52) U.S. Cl.
  CPC ........ *H01L 21/823431* (2013.01); *H01L 21/823481* (2013.01); *H01L 21/823807* (2013.01); *H01L 21/823821* (2013.01); *H01L 21/823892* (2013.01); *H01L 27/0924* (2013.01); *H01L 29/66545* (2013.01); *H01L 29/66795* (2013.01); *H01L 21/31053* (2013.01); *H01L 21/31138* (2013.01); *H01L 21/31144* (2013.01)

(56) References Cited

U.S. PATENT DOCUMENTS

| | | | |
|---|---|---|---|
| 2014/0203369 A1 | 7/2014 | Fumitake et al. | |
| 2015/0236159 A1* | 8/2015 | He | H01L 29/66795 257/401 |
| 2015/0372144 A1* | 12/2015 | Fang | H01L 29/7851 257/192 |
| 2016/0043170 A1* | 2/2016 | Park | H01L 27/0886 257/369 |
| 2016/0126338 A1 | 5/2016 | Zhao | |
| 2017/0194436 A1* | 7/2017 | Basker | H01L 21/823431 |
| 2018/0040732 A1* | 2/2018 | Chang | H01L 29/7851 |

\* cited by examiner

SEMICONDUCTOR STRUCTURE AND FABRICATION METHOD THEREOF

CROSS-REFERENCES TO RELATED APPLICATIONS

This application claims the priority of Chinese patent application No. 201610744286.3, filed on Aug. 26, 2016, the entirety of which is incorporated herein by reference.

FIELD OF THE DISCLOSURE

The present disclosure generally relates to the field of semiconductor manufacturing technology and, more particularly, relates to semiconductor structures and fabrication methods thereof.

BACKGROUND

With the continuous increase of the integration level of semiconductor devices, the critical dimension (CD) of transistors has become smaller and smaller. With the rapid shrinking of the size of the transistors, the thickness of the gate dielectric layer and the working voltage of the transistors are unable to correspondingly change. Thus, the difficulty for preventing the short channel effect is increased; and the leakage current of the transistor is increased.

The fins of fin field-effect transistors (FinFETs) form fork-like three-dimensional (3D) structures like fishes' fins. The channel regions of the FinFETs protrude from the surface of the substrate to form the fins. The gate structures of the FinFETs cover the top and side surfaces of the fins. Thus, the reverse type layers are formed on all sides of the channel regions. Correspondingly, the gate structures are able to control the "on" and "off" of control circuits from two sides of the fins. Such a design (device structure) is able to increase the control ability of the gate structures to the channel regions; and is able to effectively suppress the short channel effect of the FinFETs.

To isolate adjacent fins, before forming the doped source/drain regions, isolation structures are formed in the substrate between adjacent fins. The isolation structures between the doped source/drain regions in different fins need to have a certain height. If the heights of the isolation structures between the doped source/drain regions in different fins are too small, the doped source/drain regions may be easy to connect together; and the performance of the FinFETs are easily affected.

The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The fabrication method includes providing a semiconductor substrate having a first region, a second region and an isolation region between the first region and the second region; forming a plurality of first fins on the semiconductor substrate in the first region and a plurality of second fins on the semiconductor substrate in the second region; forming an isolation structure, covering portions of side surfaces of the first fins and the second fins and with a top surface below the top surfaces of the first fins and the second fins, over the semiconductor substrate; and forming an isolation layer over the isolation structure in the isolation region and with a top surface coplanar or above the top surfaces of the first fins and the second fins.

Another aspect of the present disclosure includes a semiconductor structure. The semiconductor structure may include a semiconductor substrate having a first region, a second region and an isolation region between the first region and the second region; a plurality of first fins formed on the semiconductor substrate in the first region and a plurality of second fins formed on the semiconductor substrate in the second region; an isolation structure covering portions of the side surfaces of the first fins and the second fins formed on the semiconductor substrate; an isolation layer formed on a portion of the isolation structure in the isolation region; a first gate structure formed on the semiconductor substrate in the first region and across the first fins by covering portions of the side and top surfaces of the first fins; a second gate structure formed on the semiconductor substrate in the second region and across the second fins by covering portions of side and top surfaces of the second fins; first doped source/drain regions formed in the first fins at two sides of the first gate structure; and second doped source/drain regions formed in the second fins at two sides of the second gate structure.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
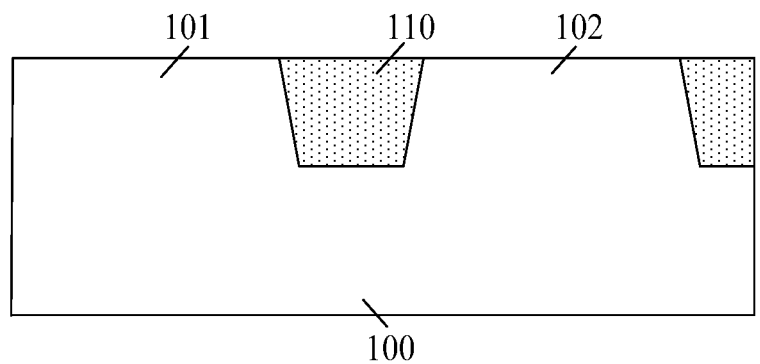
FIGS. 1-4 illustrate structures corresponding to certain stages of a fabrication process of a semiconductor structure.

FIGS. 1-4 illustrate structures corresponding to certain stages of a fabrication method of a semiconductor structure. As shown in FIG. 1, the fabrication method includes providing a base substrate. The base substrate includes a semiconductor substrate 100 and a plurality of first fins 101 and a plurality of second fins 102 on the semiconductor substrate 100.

The method also includes forming an isolation structure 110 on the semiconductor substrate 100 by a flowable chemical vapor deposition (FCVD) process. The isolation structure 110 covers the side surfaces of the first fins 101 and the second fins 102. The top surface of the isolation structure 110 levels with the top surfaces of the first fins 101 and the second fins 102.

Figure 2:
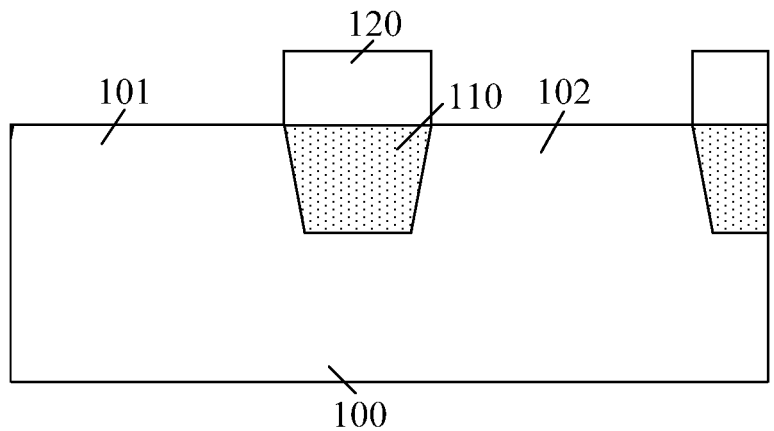

Further, as shown in FIG. 2, the method includes forming an isolation layer 120 on the isolation structure 110 between the first fins 101 and the second fins 102.

Figure 3:
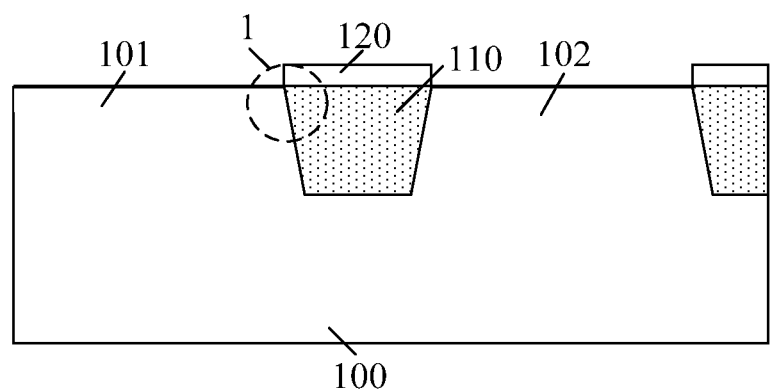
Figure 4:
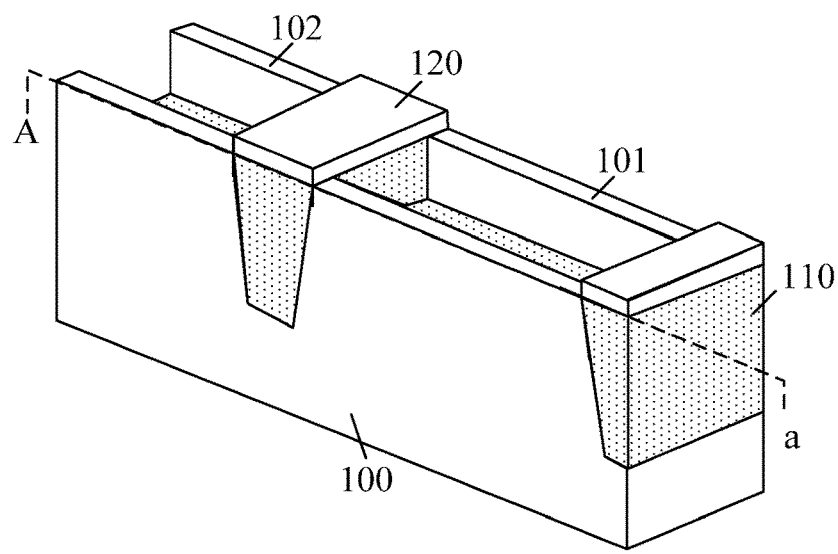

Further, as shown in FIGS. 3-4, the method includes etching the isolation structure 110 and the isolation layer 120 to cause the surface of the isolation structure 110 to be below the top surfaces of the fins 101 and the second fins 102; and to reduce the height of the isolation layer 120. FIG. 4 is a three-dimensional view of the structure illustrated in the FIG. 3; and the FIG. 3 is a cross-sectional view of the structure illustrated in FIG. 4 along the dashed line "A-a".

Further, a first gate structure (not shown) across the first fins 101 is formed on the semiconductor substrate 100. The first gate structure covers the side surfaces of the first fins 101. A second gate structure (not shown) across the second fins 102 is formed on the semiconductor substrate 100. The second gate structure covers the side surfaces of the second fins 102.

Further, first doped source/drain regions (not shown) are formed in the first fins 101 at two sides of the first gate structure by an epitaxial growth process. Second doped source/drain regions (not shown) are formed in the second fins 102 at two sides of the second gate structure by an epitaxial growth process.

In the process for forming the semiconductor structure, the isolation structure 110 is formed by the FCVD process. The FCVD process is able to allow the isolation structure 110 to fully fill the gaps between the adjacent first fins 101, the gaps between the adjacent second fins 102; and the gaps between the first fin 101 and the adjacent second fin 102.

However, the compactness of the isolation structure 110 formed by the FCVD process is not as desired; and the isolations structure 110 is easy to be etched. During the process for etching the isolation structure 110, the portion of the isolation structure 110 between the first fin 101 and the second fin 102 (the dashed region 1 illustrated in FIG. 3) is easy to be etched; and the portion of the isolation structure 110 between the first fin 101 and the second fin 102 is easy to be etched through. Thus, the isolating property of the isolation structure 110 is reduced; and the properties of the semiconductor structure are easily affected.

Further, if the isolation structure 110 between the first fin 101 and the second fin 102 is etched through, it is easy for the first doped source/drain regions and the second doped source/drain regions to connect with each other during the epitaxial process for forming the first doped source/drain regions and the second doped source/drain regions. Thus, the performance of the semiconductor structure is affected.

The present disclosure provides a semiconductor structure and a fabrication method thereof. The fabrication method includes providing a semiconductor substrate having a first region, a second region, and an isolation region between the first region and the second region; forming a plurality of first fins on the semiconductor substrate in the first region and a plurality of second fins on the semiconductor substrate in the second region; forming an isolation structure covering the side surfaces of the first fins and the second fins and with a top surface below the top surfaces of the first fins and the second fins in the semiconductor substrate; and forming an isolation layer with the top surface above or level with the top surfaces of the first fins and the second fins on the isolation structure in the isolation region.

Before forming the isolation layer, the isolation structure may be formed on the semiconductor substrate; and the top surface of the isolation structure may be below the top surfaces of the first fins and the second fins. During the process for forming the isolation layer, it may be unnecessary to perform an extra process to the isolation structure. Thus, the isolation structure may not be consumed; and the morphology and size of the isolation layer may be as desired. Accordingly, the isolation property of the isolation structure and the isolation layer may be improved; and the performance of the semiconductor structure may be enhanced.

Figure 17:
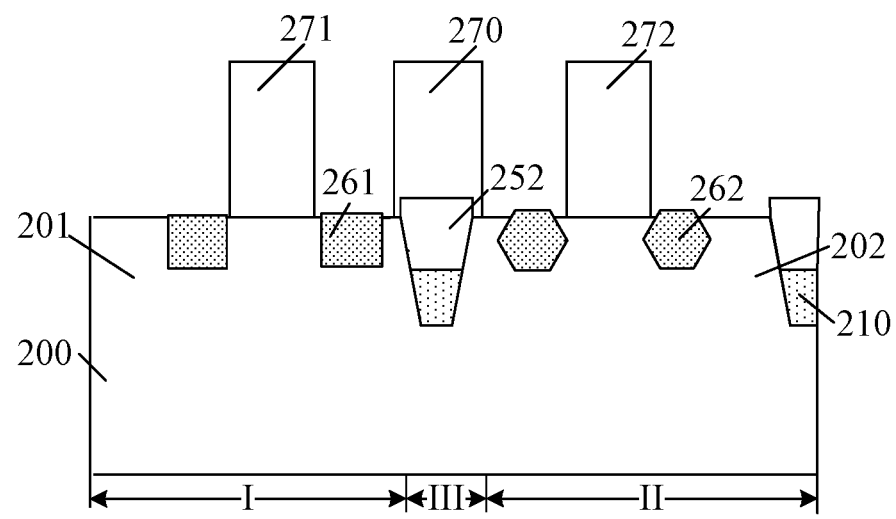
Figure 18:
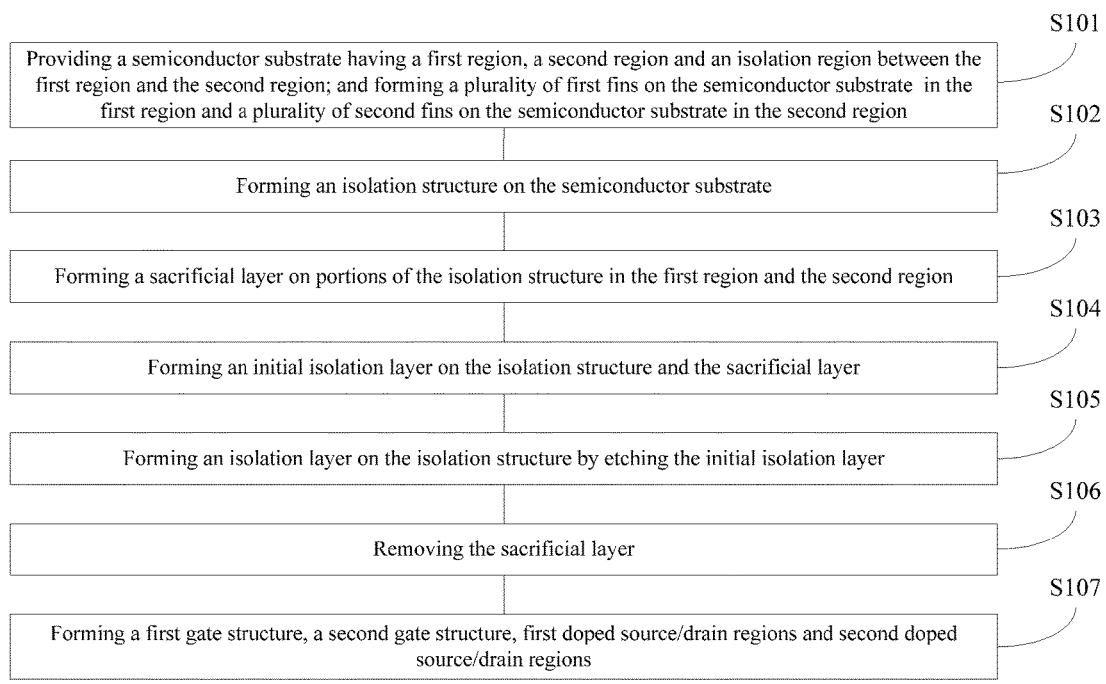
FIG. 18 illustrates an exemplary fabrication process of a semiconductor structure consistent with the disclosed embodiments.

FIG. 18 illustrates an exemplary fabrication of a semiconductor structure consistent with the disclosed embodiments. FIGS. 5-17 illustrate semiconductor structures corresponding to certain stages of the exemplary fabrication process.

Figure 5:
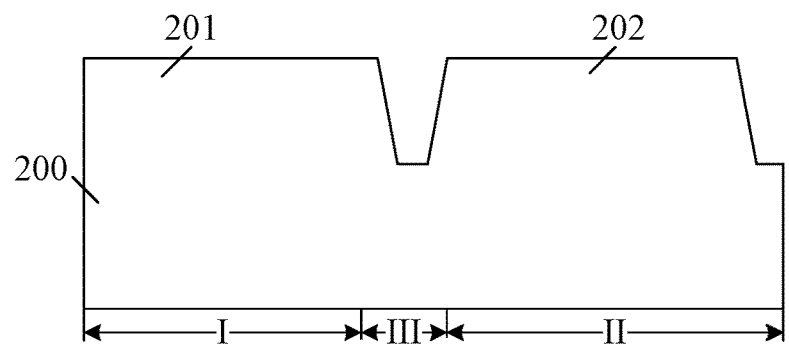
FIGS. 5-17 illustrate structures corresponding to certain stages of a fabrication process of an exemplary semiconductor structure consistent with the disclosed embodiments.

As shown in FIG. 18, at the beginning of the fabrication process, a semiconductor substrate with certain structures is provided (S101). FIG. 5 illustrates a corresponding semiconductor structure.

As shown in FIG. 5, a semiconductor substrate 200 is provided. The semiconductor substrate 200 may include a first region I, a second region II, and an isolation region III between the first region I and the second region II. A plurality of first fins 201 may be formed on the semiconductor substrate 200 in the first region I; and a plurality of second fins 202 may be formed on the semiconductor substrate 200 in the second region II.

In one embodiment, the first fins 201 and the second fins 202 may be aligned along the extension direction of the first fins 201 and the second fins 202. The plurality of first fins 201 may be aligned along the direction perpendicular to the extension direction of the first fins 201. The plurality of second fins 202 may be aligned along the direction perpendicular to the extension direction of the second fins 202.

In one embodiment, the semiconductor substrate 200 is a silicon substrate. In some embodiments, the semiconductor substrate may be a germanium substrate, a silicon germanium substrate, a silicon on insulator substrate, or a germanium on insulator substrate, etc.

In one embodiment, the first fins 201 and the second fins 202 are made of silicon. In some embodiments, the first fins 201 and the second fins 202 may be made of germanium or silicon germanium, etc.

In one embodiment, the method for forming the semiconductor substrate 200, the first fins 201 and the second fins 202 may include providing a base substrate; forming a patterned mask layer (not shown) on the base substrate; and etching the base substrate using the patterned mask layer as an etching mask.

The mask layer may be made of any appropriate material. In one embodiment, the mask layer is made of silicon nitride, or silicon oxynitride, etc.

Figure 6:
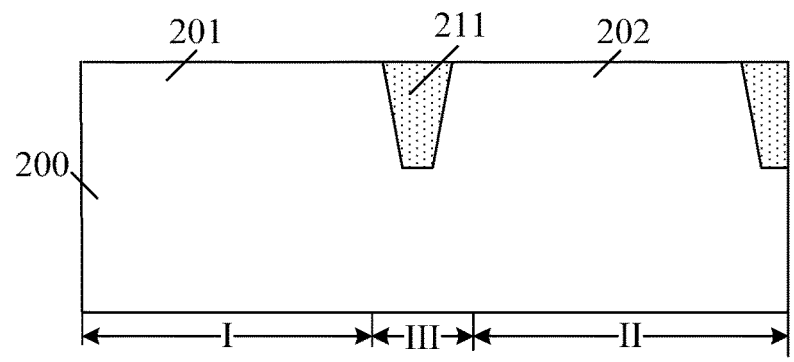
Figure 7:
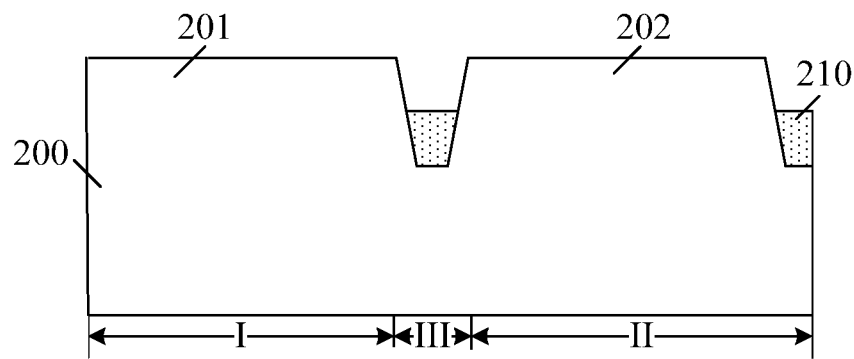
Figure 8:
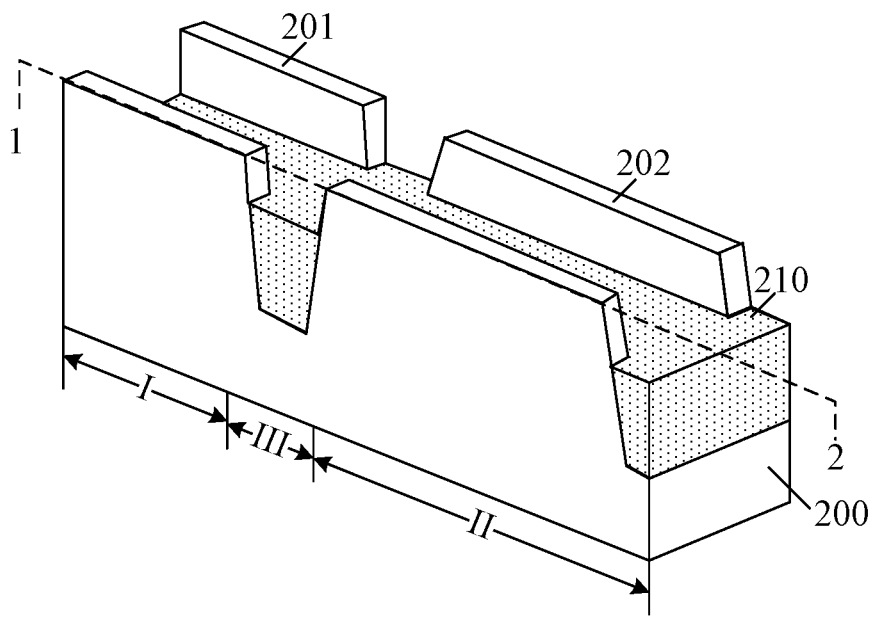

Returning to FIG. 18, after providing the semiconductor substrate 200 having the fins, an isolation structure may be formed on the semiconductor substrate 200 (S102). FIGS. 6-8 illustrate structures corresponding to certain stages of the process for forming the isolation structure. FIG. 8 is the 3D view of the structure illustrated FIG. 7; and FIG. 7 is a cross-sectional view of the structure illustrated in FIG. 8 along the dashed line 1-2.

As shown in FIG. 6, an initial isolation structure 211 is formed on the semiconductor substrate 200. The initial isolation structure 211 may cover the side surfaces of the first fins 201 and the second fins 202. The top surface of the initial isolation structure 211 may be above, or level with (i.e., not below) the top surfaces of the first fins 201 and the second fins 202.

The initial isolation structure 211 may be used to subsequently form an isolation structure. In one embodiment, the initial isolation structure 211 may be made of silicon oxide. In some embodiments, the initial isolation structure 211 may be made of silicon oxynitride.

Various processes may be used to form the initial isolation structure 211. In one embodiment, an FCVD process is used to form the initial isolation structure 211. The initial isolation structure 211 formed by the FCVD process may have a relatively strong filling ability to gaps between the first fins 201 and the adjacent second fins 202, the gaps between adjacent first fins 201, and the gaps between adjacent second fins 202. The isolation property of the subsequently formed isolation structure may be as desired.

After forming the initial isolation structure 211, as shown in FIGS. 7-8, the initial isolation structure 211 may be etched to cause the top surface of the initial isolation structure 211 to be below the top surfaces of the first fins 201 and the second fins 202. Accordingly, the insolation structure 210 may be formed.

The isolation structure 210 may be used to isolate the first fins 201 and the adjacent second fins 202; isolate the adjacent first fins 201; and isolate the adjacent second fins 202. The isolation structure 210 may also be referred to as a single diffusion break (SDB) structure After etching the initial gate structure 211 to cause the top surface of the initial isolation structure 211 to be below the top surfaces of the first fins 201 and the second fins 202, top portions of the side surfaces of the first fins 201 and the second fins 202 may be exposed. Thus, the subsequently formed first gate structure may be able to cover the exposed portions of the side surfaces of the first fins 201. Similarly, the subsequently formed second gate structure may be able to cover the exposed portions of the side surfaces of the second fins 202. Thus, the control ability of the first gate structure on the current inside the first fins 201 and the control ability of the second gate structure on the current inside the second fins 202 may be increased.

Before subsequently forming an isolation layer, the initial isolation structure 211 may be etched. The loss of the portion of the initial isolation structure 211 in the isolation region III caused by etching the initial isolation structure 211 may be subsequently compensated after forming the isolation layer. Thus, the reduction of the isolation ability of the portion of the isolation structure in the isolation region III caused by etching the initial isolation structure 211 may be prevented.

In one embodiment, the process for etching the initial isolation structure 211 to cause the portions of the initial isolation structure 211 between the adjacent first fins 201 to be below the top surfaces of the first fins 201 and to cause the portions of the initial isolation structure 211 between adjacent second fins 202 to be below the top surfaces of the second fins 202 may also cause the portion of the initial isolation structure 211 between the first fin 201 and the adjacent second fin 202 to be below the top surfaces of the first fins 201 and the second fins 202.

The initial isolation structure 211 may be etched by any appropriate process, such as a dry etching process, or a wet etching process, etc. In one embodiment, a dry etching process is used to etch the initial isolation structure 211.

An isolation layer may be subsequently formed on the portion of the isolation structure 210 in the isolation region III. The top surface of the isolation layer may be above or level with (i.e., not below) the top surfaces of the first fins 201 and the second fins 202.

Figure 9:
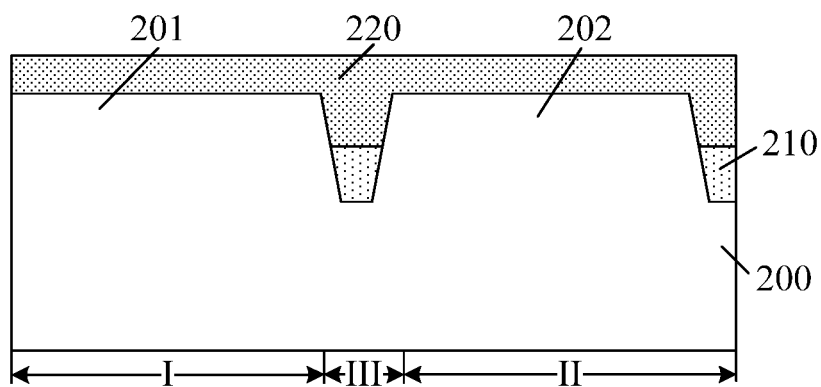
Figure 10:
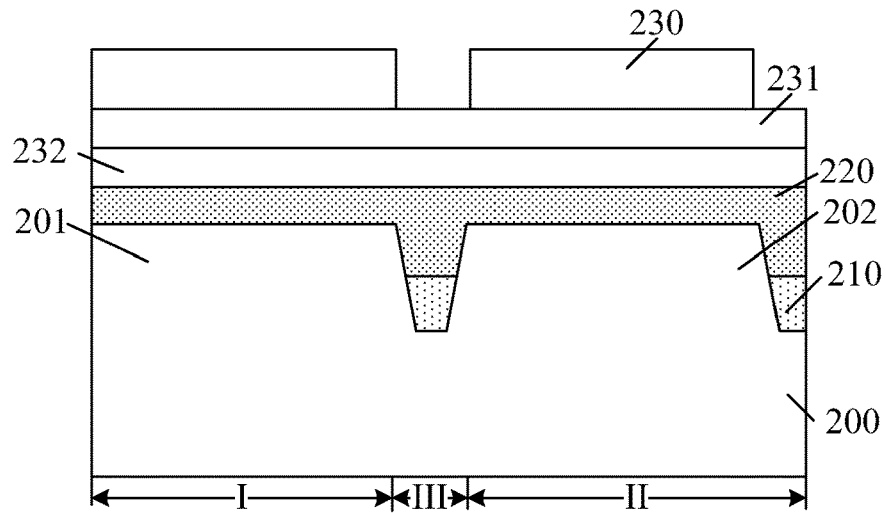
Figure 11:
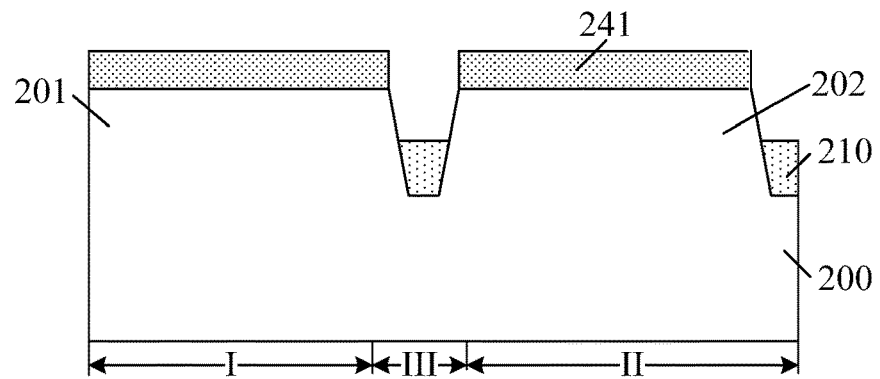

Returning to FIG. 18, after etching the initial isolation structure 211 to form the isolation structure 210, a sacrificial layer may be formed on portions of the isolation structure 210 in the first region I and the second region II (S103). FIGS. 9-11 illustrate structures corresponding to certain stages of the process for forming the sacrificial layer.

As shown in FIG. 9, an initial sacrificial layer 220 is formed on the isolation structure 210, the first fins 201 and the second fins 202. The initial sacrificial layer 220 may be used to subsequently form a sacrificial layer; and may also be used to protect the portions of the isolation structure 210 in the first region I and the second region II during the subsequent process for etching the isolation layer.

In one embodiment, the initial sacrificial layer 220 may also be on the top surfaces of the first fins 201 and the second fins 202. The portions of the initial sacrificial layer 220 on the first fins 201 and the second fins 202 may be used to protect the first fins 201 and the second fins 202 during the subsequent process for removing the initial isolation layer on the initial sacrificial layer 220.

The initial sacrificial layer 220 may be made of any appropriate material. In one embodiment, the initial sacrificial layer 220 is a spin-on carbon (SOC) layer. In some embodiments, the initial sacrificial layer may be an organic dielectric layer.

In one embodiment, the spin-on carbon layer is a carbon-containing polymer. Specifically, the carbon-containing polymer may contain a benzene ring and alkyl containing polymer. The mass percentile of carbon atoms in the initial sacrificial layer 220 may be in a range of approximately 85%-90%.

If the thickness of the initial sacrificial layer 220 is too small, the subsequent protection function to the first fins 201, the second fins 202 and the isolation structure 210 may be relatively weak. If the thickness of the initial sacrificial layer 220 is too large, it may be easy to increase the difficulty for subsequently etching the initial sacrificial layer 220. Thus, the thickness of the initial sacrificial layer 220 may be in a range of approximately 1000 Å-2000 Å.

Various processes may be used to form the initial sacrificial layer 220. In one embodiment, the initial sacrificial layer 220 is formed by a spin-coating process.

Further, as shown in FIGS. 10, after forming the initial sacrificial layer 220, a bottom anti-reflective layer 232 may be formed on the initial sacrificial layer 220; a dielectric anti-reflective layer 231 may be formed on the bottom anti-reflective layer 232; and a patterning layer 230 may be formed on the dielectric anti-reflective layer 232.

The patterning layer 203 may be formed on the initial sacrificial layer 220 over the first region I and the second region II; and may be used to protect the initial sacrificial layer 220 over the first fins 201 and the second fins 202 from being etched. The patterning layer 203 may have an opening (not labeled) over the portion of the isolation structure 210 in the isolation region III; and may be used to subsequently remove the portion of the initial sacrificial layer 220 in the isolation region III.

The patterning layer 230 may be made of any appropriate material. In one embodiment, the pattern layer 230 is a patterned photoresist layer.

In one embodiment, the bottom anti-reflective layer 232 and the dielectric anti-reflective layer 231 may be used to planarize the etching surface; and to reduce the light reflection of the etching surface.

The bottom anti-reflective layer 232 may be made of any appropriate material. In one embodiment, the bottom anti-reflective layer 232 is made of organic material.

The dielectric anti-reflective layer 231 may be made of any appropriate material. In one embodiment, the dielectric layer anti-reflective layer 231 is made of silicon oxynitride.

After forming the patterning layer 230, as shown in FIG. 11, the initial sacrificial layer 220 may be etched using the patterning layer 230 as an etching mask. The portion of the initial sacrificial layer 220 on the isolation structure 210 in the isolation region III may be removed; and the sacrificial layer 241 may be formed.

The sacrificial layer 241 may be used to protect the first fins 201, the second fins 202 and the isolation structure 210 during the subsequent process for removing the portion of an initial isolation layer on the sacrificial layer 241. Further, the sacrificial layer 241 may be also be able to prevent the portions of the isolation structure 210 in the first region I and the second region, and on the first fins 201 and the second fins 202 from being etched during the subsequent process for etching the isolation layer.

The initial sacrificial layer 220 may be etched by any appropriate process. In one embodiment, a dry etching process is used to each the initial sacrificial layer 220. The etching gases of the dry etching process may include $O_2$, $SO_2$ and $N_2$, etc.

In one embodiment, the pressure of the reaction chamber of the dry etching process may be in a range of approximately 5 mTorr-20 mTorr. The bias voltage may be in a range of approximately 100 V-500 V.

In one embodiment, the material of the sacrificial layer 241 may be identical to the material of the initial sacrificial layer 220. Specifically, the initial sacrificial layer 241 may be a spin-on carbon layer. In some embodiments, the sacrificial layer may be an organic dielectric layer.

In one embodiment, the thickness of the sacrificial layer 241 may be in a range of approximately 1000 Å-2000 Å.

Further, as shown in FIG. 11, after forming the sacrificial layer 241, the patterning layer 230 (referring to FIG. 10) may be removed. Then, the dielectric anti-reflective layer 231 (referring to FIG. 10) may be removed; and the bottom anti-reflective layer 232 (referring to FIG. 10) may be removed.

Figure 12:
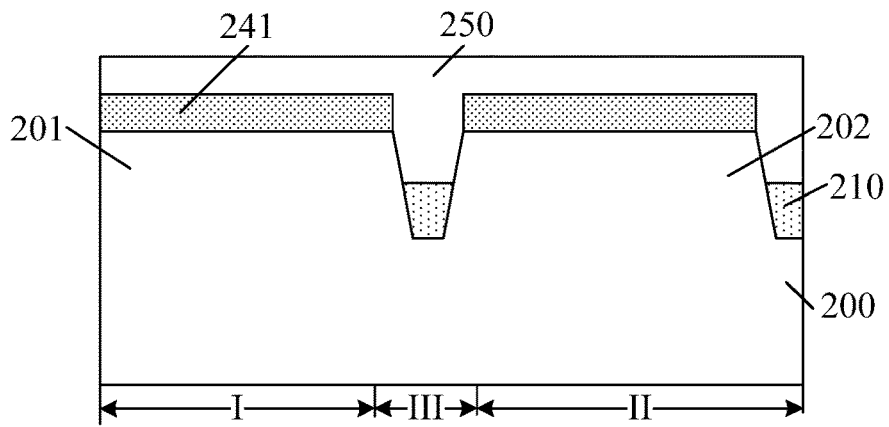

Returning to FIG. 18, after forming the sacrificial layer 241, an initial isolation layer may be formed (S104). FIG. 12 illustrates a corresponding semiconductor structure.

As shown in FIG. 12, an initial isolation layer 250 is formed on the exposed portion of the isolation structure 210 and the sacrificial layer 241. The initial isolation layer 250 may be used to subsequently form an isolation layer.

The initial isolation layer 250 may be made of any appropriate material. In one embodiment, the initial isolation layer 250 is made of silicon oxide.

Various processes may be used to form the initial isolation layer 250, such as a high density plasma deposition process, or a high aspect ratio deposition process, etc. The initial isolation layer 250 formed by the high density plasma deposition process or the high aspect ratio deposition process may have a relatively high compactness, the material loss during the subsequent process for removing the sacrificial layer 241 may be relatively small. Thus, the isolation properties of the subsequently formed isolation layer may be as desired.

Figure 13:
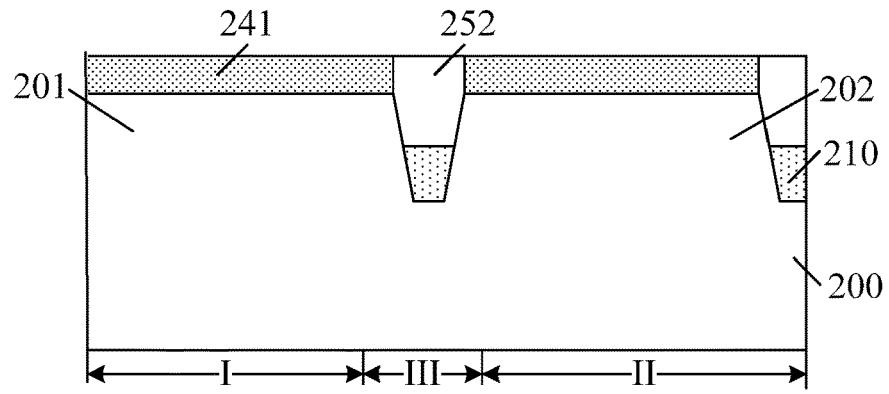

Returning to FIG. 18, after forming the initial isolation layer 250, an isolation layer may be formed (S105). FIG. 13 illustrates a corresponding semiconductor structure.

As shown in FIG. 13, an isolation layer 252 is formed. The isolation layer 252 may be formed by removing the portion of the initial isolation layer 250 above the sacrificial layer 241.

The isolation layer 252 may be used to isolate the subsequently formed first doped source/drain regions and the second doped source/drain regions; and prevent the first doped source/drain regions and the second doped source/drain regions from connecting together.

The portion of the initial isolation layer 250 above the sacrificial layer 241 may be removed by any appropriate process. In one embodiment, a chemical mechanical polishing process is used to remove the portion of the initial isolation layer 250 above the sacrificial layer 241 until the sacrificial layer 241 is exposed.

Figure 14:
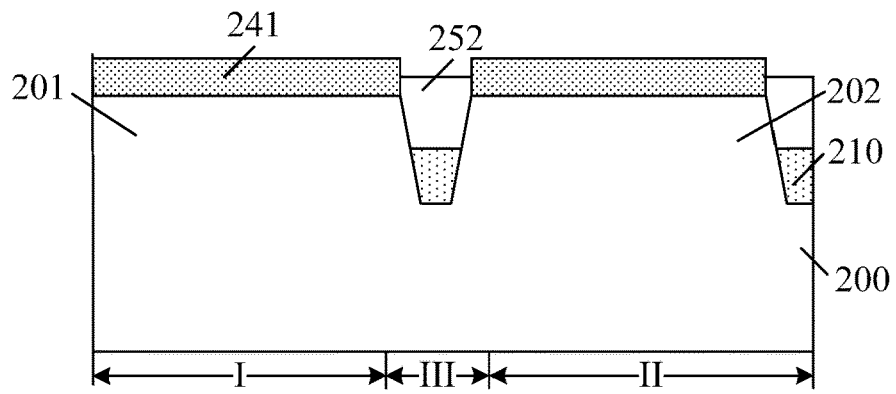
Figure 15:
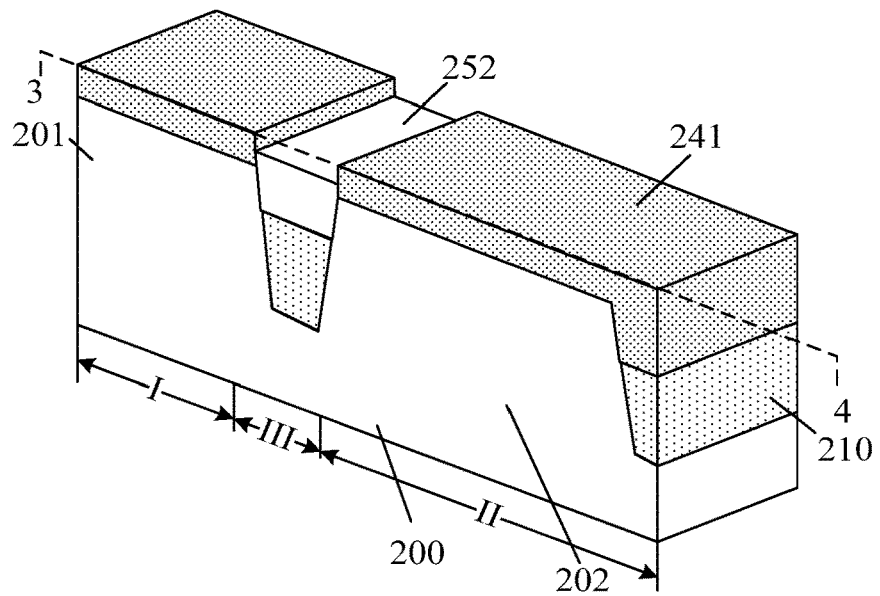

In one embodiment, after forming the isolation layer 252, the top surface height of the isolation layer 252 may be reduced. FIGS. 14-15 illustrate a corresponding semiconductor structure. FIG. 15 is a 3D view of the structure illustrated in FIG. 14; and FIG. 14 is a cross-sectional view of the structure illustrated in FIG. 15 along the dashed line 3-4.

As shown in FIGS. 14-15, the top surface of the isolation layer 252 may be recessed; and the top surface height, i.e., the height of the top surface the isolation layer 252 along the direction perpendicular to the semiconductor substrate 200, may be reduced. That is, the top surface of the isolation layer 252 may be below the top surface of the sacrificial layer 241.

The purpose for etching the isolation layer 252 is to cause the height difference between the top surface of the isolation layer 252 and the top surfaces of the first fins 201 and the second fins 202 to match the design requirements.

If the top surface height of the isolation layer 252 is too large, it may be not good for subsequently forming a dummy gate structure. If the top surface height of the isolation layer 252 is too small, it may not be good for preventing the connection between the subsequently formed first doped source/drain regions and second doped source/drain regions. In one embodiment, the height difference between the top surface of the isolation layer 252 and the top surfaces of the first fins 201 and the second fins 202 may be in a range of approximately 200 Å-800 Å.

Because the sacrificial layer 241 may cover the portions of the isolation structure 210 in the first region I and the second region II, during the process for etching the isolation layer 252, the sacrificial layer 241 may be able to protect the portions of the isolation structure 210 in the first region I and the second region II. Accordingly, it may prevent the portions of the isolation structure 210 in the first region I and the second region II from being etched. Further, because the sacrificial layer 241 may cover side surfaces of the initial isolation layer 250, the consumption of the side surfaces of the initial isolation layer 250 may be reduced.

The isolation layer 252 may be etched by any appropriate process. In one embodiment, a dry etching process is used to etch the isolation layer 252. In some embodiments, a wet etching process may be used to etch the isolation layer.

In some embodiments, after removing the portion of the initial isolation layer above the sacrificial layer, if the height difference between the top surface of the initial isolation layer on the isolation structure and the top surfaces of the first fins and the second fins matches the designed requirement, the process for etching the isolation layer may be omitted.

Figure 16:
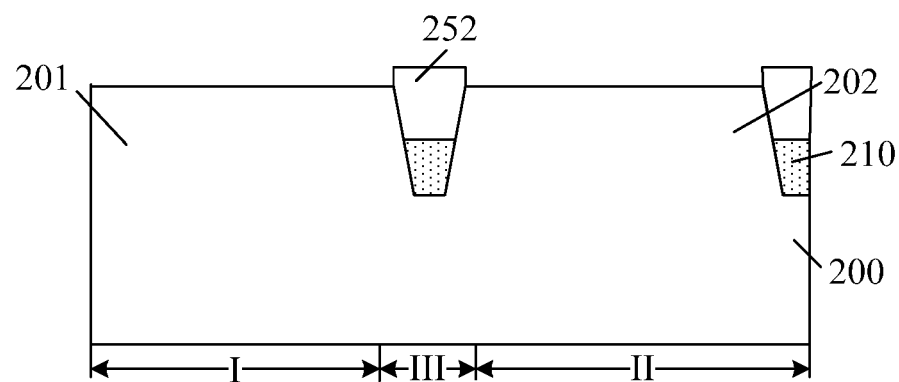

Returning to FIG. 18, after removing the portion of the initial layer 250 on the sacrificial layer 241 (referring to FIG. 13 and FIG. 15), the sacrificial layer 241 may be removed (S106). FIG. 16 illustrates a corresponding semiconductor structure.

As shown in FIG. 16, the sacrificial layer 241 is removed. The first fins 201, the second fins 202 and the isolation layer 252 may be exposed.

During the process for removing the sacrificial layer 241, the isolation structure 210 and the isolation layer 252 may also be removed with a certain removing rate. The ratio between the removing rate of the sacrificial layer 241 and the removing rate of the isolation structure 210 may be any appropriate value. If the ratio between the removing rate of the sacrificial layer 241 and the removing rate of the isolation structure 210 is too small, it may cause the isolation structure 210 and the isolation layer 252 to be consumed too much; and the performance of the semiconductor structure may be deteriorated. Thus, the ratio between the removing rate of the sacrificial layer 241 and the removing rate of the isolation structure 210 should not be too small. In one embodiment, the ratio between the removing rate of the sacrificial layer 241 and the removing rate of the isolation structure 210 may be greater than 10.

The sacrificial layer 241 may be removed by any appropriate process. In one embodiment, the sacrificial layer 241 is a spin-on carbon layer, a plasma ashing process may be used to remove the sacrificial layer 341.

In one embodiment, during the plasma ashing process for removing the sacrificial layer 241, the ratio between the removing rate of the sacrificial layer 241 and the removing rate of the isolation structure 210 may be relatively large. The consumption of the isolation structure 210 and the isolation layer 252 caused by the plasma ashing process may be relatively small.

Returning to FIG. 18, after removing the sacrificial layer 241, a first gate structure, a second gate structure, first doped source/drain regions and second doped source/drain regions may be formed (S107). FIG. 17 illustrates a corresponding semiconductor structure.

As shown in FIG. 17, a first gate structure 271 crossing over the first fins 201 may be formed over the semiconductor substrate 200. The first gate structure 271 may cover portions of the side and top surfaces of the first fins 201. A second gate structure 272 crossing over the second fins 202 may be formed over the semiconductor substrate 200. The second gate structure 272 may cover portions of side and top surfaces of the second fins 202.

Further, first doped source/drain regions 261 may be formed in the first fins 201 at two sides of the first gate structure 271. Second doped source/drain regions 262 may be formed in the second fins 202 at two sides of the second gate structure 272.

Further, as shown in FIG. 17, in some embodiments, a dummy gate structure 270 may be formed on the isolation layer 252.

The first doped source/drain regions 261 and the second doped source/drain regions 262 may be formed by any appropriate process. In one embodiment, epitaxial growth processes are used to form the first doped source/drain regions 261 and the second doped source/drain regions 262.

Specifically, the process for forming the first doped source/drain regions 261 and the second doped source/drain regions 262 may include forming first trenches in the first fins 201 at two sides of the first gate structure 271; forming second trenches in the second fins 202 at two sides of the second gate structure 272; forming the first doped source/drain regions 261 in the first trenches by an epitaxial growth process; and forming the second doped source/drain regions 262 in the second trenches by an epitaxial growth process.

Because the isolation structure 210 and the isolation layer 252 may be between the first trenches and the adjacent second trenches; and the top surface of the isolation layer 252 and the top surfaces of the first fins 201 and the second fins 202 may have a certain height difference, the isolation layer 252 may be able to isolate the first trenches and the adjacent second trenches. Thus, the first doped source/drain regions 261 and the second doped source/drain regions 262 may not be easy to connect with each other during the epitaxial growth processes.

The dummy gate structure 270 may be formed on the isolation layer 252 after forming the isolation layer 252. The dummy gate structure 270 may be used to protect the isolation layer 252 during the processes for forming the first trenches and the second trenches.

Thus, a semiconductor structure may be formed by the disclosed methods and processes. FIG. 17 illustrates a corresponding semiconductor structure.

As shown in FIG. 17, the semiconductor structure may include a semiconductor substrate 200 having a first region I, a second region II and an isolation region III between the first region I and the second region II; a plurality of first fins 201 formed on the semiconductor substrate 200 in the first region I; and a plurality of second fins 202 formed on the semiconductor substrate 200 in the second region II. The semiconductor structure may also include an isolation structure 210 formed on the semiconductor substrate 200 and covering portions of the side surfaces of the first fins 201 and the second fins 202; and an isolation layer 252 formed on the portion of the isolation structure 210 in the isolation region III. Further, the semiconductor structure may include a first gate structure 271 crossing over the first fins 201 and covering portions of the side and top surfaces of the first fins 201 formed on the semiconductor substrate 200 in the first region I; a second gate structure 272 crossing over the second fins 202 and covering portions of the side and top surfaces of the second fins 202 formed on the semiconductor substrate 200 in the second region II; and a dummy gate structure 270 formed on the isolation layer 252. Further, the semiconductor structure may also include first doped source/drain regions 261 formed in the first fins 201 at two sides of the first gate structure 271; and second doped source/drain regions 262 formed in the second fins 202 at two sides of the second gate structure 272. The detailed structures and intermediate structures are described above with respect to the fabrication processes.

Thus, according to the disclosed embodiments, before forming the isolation layer, an isolation structure may be formed on the semiconductor substrate; and the top surface of the isolation structure is below the top surfaces of the first fins and the second fins. During the process for forming the isolation layer, the isolation structure may not need to be treated. Thus, the isolation structure may not be easily consumed and the morphology and size of the isolation layer may be as desired. Thus, the isolation property of the isolation structure and the isolation layer may be improved; and the performance of the semiconductor structure may be improved.

Further, the sacrificial layer may cover the surfaces of the portions of the isolation structure in the first region and the second region and the side surfaces of a portion of the isolation layer. Thus, the during the process for etching the initial isolation layer, it may not be easy to consume the portions of the isolation structure in the first region and the second region and the side surfaces of the isolation layer. Accordingly, the isolation property of the isolation structure and the isolation layer in the isolation region may be improved.

Further, before forming the initial isolation layer, the sacrificial layer may be formed on the top surfaces of the first fins and the second fins. The sacrificial layer may be able to protect the isolation structure, the first fins and the second fins during the process for removing the portion of the initial isolation layer on the sacrificial layer. The sacrificial layer may also be able to protect the portions of the isolation structure in the first region and the second region during the process for etching the isolation layer. Thus, the isolation property of the portion of the isolation structure in the isolation region may be improved.

Further, the sacrificial layer may be a spin-on carbon layer, or an organic dielectric layer; and may be removed by a plasma ashing process. The removing rate of the plasma ashing process to the isolation layer may be significantly smaller than the removing rate of the plasma ashing process to the sacrificial layer. Thus, during the process for removing the sacrificial layer, the consumption of the isolation structure may be relatively small. Accordingly, the property of the semiconductor structure may be improved.

Further, the isolation layer may be formed between the first fins and the second fins; and the top surface of the isolation layer may be above the top surfaces of the first fins and the second fins. Thus, during the epitaxial process for forming the first doped source/drain regions and the second doped source/drain regions, the first doped source/drain regions and the second doped source/drain regions may not be easy to connect to etch other. Accordingly, the property of the semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
    providing a semiconductor substrate having a first region, a second region, and an isolation region between the first region and the second region;
    forming a plurality of first fins on the semiconductor substrate in the first region and a plurality of second fins on the semiconductor substrate in the second region;
    forming an isolation structure, covering portions of side surfaces of the first fins and the second fins and with a top surface below the top surfaces of the first fins and the second fins, over the semiconductor substrate; and
    forming an isolation layer over the isolation structure in the isolation region and with a top surface coplanar or above the top surfaces of the first fins and the second fins, wherein forming the isolation layer comprises:
        forming a sacrificial layer over the isolation structure, the first fins and the second fins and exposing a portion of the isolation structure in the isolation region;
        forming an initial isolation layer on exposed portion of the isolation structure and on the sacrificial layer;
        removing a portion of the initial isolation layer on the sacrificial layer; and
        removing the sacrificial layer.

2. The method according to claim 1, wherein:
the sacrificial layer is one of a spin-on carbon layer and an organic dielectric layer.

3. The method according to claim 2, wherein:
the spin-on carbon layer is made of carbon-containing polymer.

4. The method according to claim 3, wherein:
a mass percentile of carbon atoms in the spin-on carbon layer is in a range of approximately 85%-90%.

5. The method according to claim 1, wherein:
a thickness of the sacrificial layer is in a range of approximately 1000Å-2000Å.

6. The method according to claim 1, wherein forming the sacrificial layer comprises:
    forming an initial sacrificial layer on the isolation structure, the first fins and the second fins; and
    removing a portion of the initial sacrificial layer on the portion of the isolation structure in the isolation region.

7. The method according to claim 1, wherein:
a ratio between a removing rate of the sacrificial layer and a removing rate of the isolation structure is greater than approximately 10.

8. The method according to claim 7, the sacrificial layer being one of a spin-on carbon layer and an organic dielectric layer, wherein:
    the sacrificial layer is removed by a plasma ashing process.

9. The method according to claim 1, wherein forming the isolation layer further comprises:
    etching the isolation layer using the sacrificial layer as an etching mask after removing the portion of the initial isolation layer on the sacrificial layer.

10. The method according to claim 1, wherein forming the isolation structure comprises:
    forming an initial isolation structure covering side surfaces of the first fins and the second fins and with a top surface not below top surfaces of the first fins and the second fins; and
    etching the initial isolation structure to cause the top surface of the isolation structure to be below the first fins and the second fins.

11. The method according to claim 10, wherein: the initial isolation structure is formed by a flowable chemical vapor deposition process.

12. The method according to claim 1, after forming the isolation layer, further comprising:
    forming a first gate structure over the semiconductor substrate and across the first fins by covering top and side surfaces of the first fins;
    forming a second gate structure over the semiconductor substrate and across the second fins by covering top and side surfaces of the second fins;
    forming first doped source/drain regions in the first fins at two sides of the first gate structure; and
    forming second doped source/drain regions in the second fins at two sides of the second gate structure,
    wherein the first doped source/drain regions and the second doped source/drain regions are at two sides of the isolation layer.

13. The method according to claim 12, wherein:
the first doped source/drain regions and the second doped source/drain regions are formed by epitaxial growth processes.

14. The method according to claim 12, after forming the isolation layer, further comprising:
    forming a dummy gate structure on the isolation layer.

* * * * *